July 12, 1955 R. W. HAEGELE 2,713,117

HETERODYNE CONVERTER

Filed June 18, 1949 2 Sheets-Sheet 1

INVENTOR.
Rowland W. Haegele
BY
Paul S. Martin
ATTORNEY

INVENTOR.
*Rowland W. Haegele*
BY
*Paul S. Martin*
ATTORNEY

United States Patent Office 2,713,117

Patented July 12, 1955

2,713,117

HETERODYNE CONVERTER

Rowland W. Haegele, Bayside, N. Y., assignor to Sylvania Electric Products Inc., a corporation of Massachusetts Application June 18, 1949, Serial No. 99,895

6 Claims. (Cl. 250—20)

The present invention relates to a novel electrical translating device and to circuits including that device for obtaining the cross-products of plural input signals, such circuits being variously termed mixers, modulators, heterodyne detectors, etc. and to amplifiers.

The embodiments in accordance with the present invention that are described in greater detail below utilize a semiconductor such as purified germanium that is crystallized and doped with a small percentage of tin, and appropriately polished and etched. Semiconductor devices using such germanium crystals and having a pair of mutually close whiskers or pointed resilient wires of small diameter and a main base contact have been described recently in the literature as amplifiers. It has been observed that such amplifiers are limited in their operation to a maximum of 10 megacycles per second. This invention is concerned with a translator having three whiskers and in contact with the prepared semiconductor surface. They are sufficiently close to each other to achieve interaction as in a two-whisker amplifier between any pair when one is supplied with a signal while the other includes an output load impedance, appropriate operating voltages being supplied. In one converter circuit embodiment the signals to be mixed are separately applied to two of the three whiskers while the sum and/or difference heterodyne output is obtained in a circuit including the third whisker. Such a mixer not only produces a heterodyne output at substantial conversion gain but operates at input frequencies which are well above the maximum operating frequency of the semiconductor amplifier based on similarly prepared semiconductor elements. Furthermore, despite the close proximity of the input whiskers to each other, there is only a very limited degree of interaction between the input circuits. The three-whisker semiconductor converter is useful not only where conversion is desired, but it also enables amplification of signals whose frequencies are above the limit of two-whisker amplifiers, provided that frequency conversion is permissible. The higher operating frequencies of the three-whisker converter as compared to the two-whisker amplifier is a very valuable feature of the novel device.

Substantial conversion gain is realized where the difference-frequency is below the cutoff frequency. Where the signals to be combined are sufficiently low it is entirely feasible to obtain conversion gain in obtaining the sum of the frequencies combined, provided that the sum-frequency does not exceed the upper frequency limit of the two-whisker amplifier.

Other circuit embodiments of the three-whisker semiconductor unit are described in detail below, in which one of the input signals is locally generated while the other signal to be mixed is supplied by an external signal source.

The illustrative embodiments of various phases of the invention are shown in the accompanying drawings in which.

Figure 1:
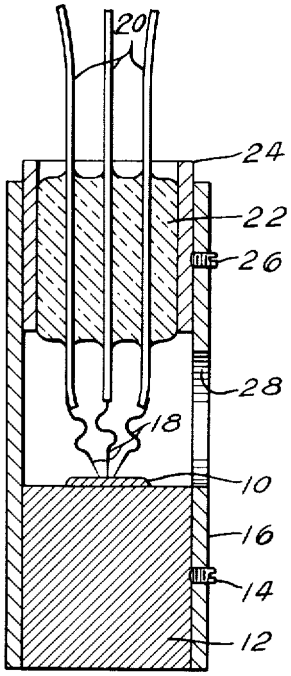
Fig. 1 is a longitudinal cross-section of a three-whisker translating element, illustrative of devices used in the invention.

In Fig. 1 a small flat body of semiconductor, as for example a properly processed germanium crystal, is shown at 10 mounted on a metal plug 12 that is adjustably secured by set screw 14 in sleeve 16. Three resilient tungsten whiskers 18 or point-contact elements are supported in contact with body 10 by leads 20 to which they are severally welded, leads 20 being carried by a glass plug 22 formed within metal sleeve 24 that is adjustably secured by set screw 26 within sleeve 16. Glass 22 is fused in a preliminary operation while whiskers 18 are in adjustment to have their ends lie in a plane, in a small triangle of approximately .002 inch mutual separation. When the device of Fig. 1 is assembled it may be necessary to shift one of the whiskers in relation to the others to adjust the mutual spacings, and this may be accomplished through aperture 28 in sleeve 16. The pressure of the whiskers on the crystal is somewhat critical and is adjusted by sliding one plug 12 or the other 22 within sleeve 16 while observing test instruments connected to plug 12 and leads 20. One of the three whiskers 18 is preferably pulsed to better adapt it as an output contact element whereas the others are not ordinarily pulsed.

Figure 2:
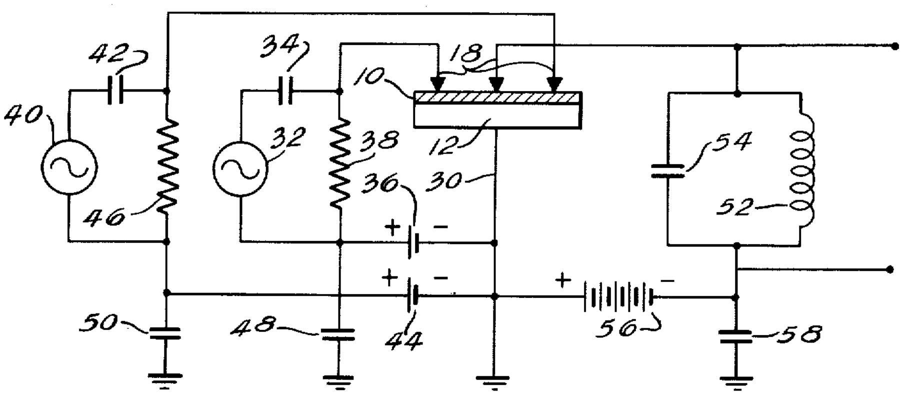
Fig. 2 is a schematic of a frequency-converting or modulating circuit embodying certain aspects of the invention and incorporating the translating element of Fig. 1.

The device of Fig. 1 is embodied in the circuit of Fig. 2 wherein the body 10 of processed crystalline germanium is supported on plug 12 or base contact to which the common return 30 of the several circuits is connected. A first signal source 32 is coupled through direct-current blocking-condenser 34 to one of the input whiskers 18, and this whisker is biased by direct-current source 36 through resistor 38. A second signal source 40 is similarly coupled through a blocking condenser 42 to an input whisker 18 that is appropriately biased by direct-current supply 44 through resistor 46. Supplies 36 and 44 are bypassed by condensers 48 and 50 respectively.

The output contact 18 derives the modulation products of the signals supplied by sources 32 and 40, developed across an impedance that is represented by a parallel-resonant circuit including coil 52 and condenser 54 in series with direct-current supply 56 that is bypassed by condenser 58. The band-pass characteristics of this output impedance are designed to transmit desired components and suppress the others.

With the input contacts biased positively and the output contacts biased negatively as shown, of the order of 1.0 and 40 volts respectively, individual frequencies or signals of composite frequencies may be separately impressed upon the input contacts by sources 32 and 40. Heterodyne output is developed across the circuit 52, 54. The upper frequency limit of the output in the embodiment described, to the extent that conversion gain may be desired, is approximately 10 megacycles per second but the output starts to fall off at about 3 megacycles per second. Useful mixing without gain can nevertheless be realized above this output frequency limit.

Despite the close proximity of input contacts 18 there is but a negligible degree of interaction between the input signal sources. If the input frequencies are above the cutoff frequency of the device as a two-whisker semiconductor amplifier, then there will of course be no substantial transmission of the input signals to the output circuit; but in any event there is ordinarily sufficient distinction between each input signal and the heterodyne product so that the signals of input frequency can be separated in a properly designed output circuit.

Conversion gain can be realized readily for frequencies below cutoff of the comparable two-whisker amplifier; but useful (if reduced) heterodyne output for frequencies above that cutoff is obtainable.

Figure 3:
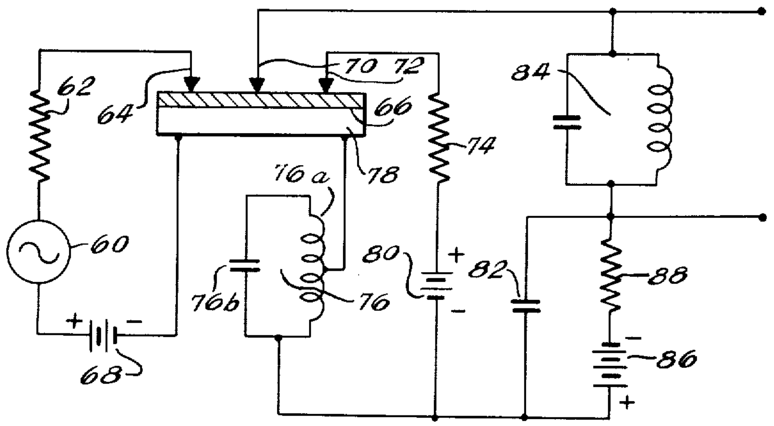
Figs. 3 and 4 are schematics embodying additional circuit aspects of the invention.
Figure 4:
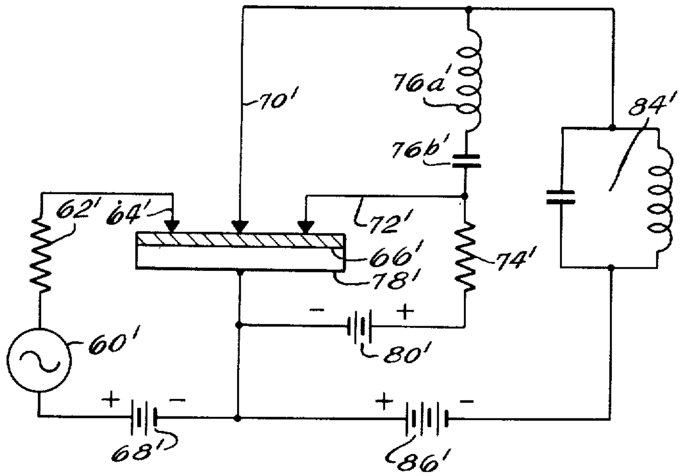

Figs. 3 and 4 illustrate two forms of converters in which the three-whisker translating element is utilized not only to mix two signals of different frequencies and obtain the heterodyne output but additionally for generating one of those two signals. Thus in Fig. 3, signal from external source 60 is impressed through an impedance 62 on one whisker 64 of a three-whisker translating element represented by 66. In the case of n-type semiconductors such as the standard commercial germanium, it is desirable to provide positive bias for whisker 64, by means of direct-current supply 68.

Two other whiskers or contact elements 70 and 72 are used in a circuit constituting a local oscillator. As an amplifying section of the device, input contact element 72 applies a signal through impedance 74 at a frequency largely determined by resonant circuit 76 that is connected to the base contact 78 of translating element 66. This resonant circuit includes tapped impedance-matching coil **76*a* and condenser 76*b*. Direct current at appropriate voltage is supplied by source 80. The local oscillator circuit is completed to heterodyne output electrode 70 by bypass condenser 82 and heterodyne output impedance 84. Direct current at an appropriate voltage is also applied to element 70 by source 86 through decoupling impedance 88. The local oscillator, that includes resonator 76 in the common return to base contact 78 from whiskers 70 and 72, seems to function by virtue of a negative resistance characteristic that is developed between contacts 72 and 78, and contact 70** apparently serves the purpose of establishing the required direct-current conditions for this type of operation.

The circuit of Fig. 4 in which primed numerals are used corresponding to Fig. 3 closely resembles that in Fig. 3 and is believed to operate in much the same fashion, except that the negative resistance characteristic that is found between contacts 72 and 78 is here found between contacts 70' and 72', and a series-resonant circuit including coil **76*a*' and direct-current blocking condenser 76*b*' replaces parallel-resonant circuit 76. The heterodyne output appears across load 84'** as in the circuit of Fig. 3.

The foregoing disclosure evidently involves numerous details that will naturally be capable of modification and rearrangement by those skilled in the art, and consequently the appended claims should be allowed a latitude of interpretation that is consistent with the spirit and scope of the invention.

What is claimed is:

1. A converter comprising a translating element having a body of semiconductor material, a base contact, and three mutually close electrically interacting whiskers, an input signal circuit connected to one of said three whiskers, a local oscillator circuit including the remaining two whiskers, and an output circuit connected to one of said oscillator circuit whiskers offering matching impedance to the modulation products of the input signals.

2. A heterodyne converter in accordance with claim 1 in which said oscillator circuit includes a parallel-resonant circuit in common to circuits between said base contact and said two whiskers.

3. A heterodyne circuit in accordance with claim 1 in which said local oscillator circuit includes a series-resonant circuit between the two whiskers in the local oscillator.

4. A heterodyne converter comprising a body of semiconductive material, a base contact element and three additional contact elements, said additional contact elements being arranged in a triangle mutually close to each other and individually occupying only a very limited area, circuit connections between two of said elements and the base contact constituting a local oscillator, an input circuit to the third of said contact elements for applying an input signal to be mixed with the locally generated signal, and an output circuit connected to one of the two local oscillator contact elements.

5. A converter comprising a translating element having a body of semiconductive material, a base contact on said body, and three sharp contacts including a first, second and a third contact positioned in engagement with said body sufficiently close to each other to produce signal interaction within said body, a local oscillator including a resonant circuit, and a beat frequency circuit including an element of said oscillator and a load impedance connected in series between said base contact and one of said sharp contacts, a connection between a second one of said sharp contacts and said local oscillator and an input signal source connected between the third of said sharp contacts and the base contact.

6. A converter including a translating element having a body of semiconductive material, a base contact thereon, and three sharp contacts thereon sufficiently close to each other to produce electrical interaction in said body, an input signal source of a first frequency connected between one of said sharp contacts and said base contact, a direct-current-conductive local oscillator circuit including a coil and a condenser connected in parallel and resonant at a frequency different from that of the signal source, said oscillator circuit being connected between a second one of said sharp contacts and said base contact and including a direct-current supply biasing said second sharp contact positive with respect to said base contact, a direct-current-conductive load circuit having a parallel coil and condenser providing impedance at the frequency-difference between said signal source and said local oscillator frequency, said load circuit being connected between the third one of said sharp contacts and said base contact and including biasing means making said third sharp contact negative with respect to said base contact, and a direct-current-blocking signal transmitting device coupling said load circuit to said oscillator circuit.

References Cited in the file of this patent

UNITED STATES PATENTS

| | | |
|---|---|---|
| 2,325,664 | Cohn | Aug. 3, 1943 |
| 2,370,758 | Thompson | Mar. 6, 1945 |
| 2,455,657 | Cork et al. | Dec. 7, 1948 |
| 2,469,569 | Ohl | May 10, 1949 |
| 2,476,323 | Rack | July 19, 1949 |
| 2,486,776 | Barney | Nov. 1, 1949 |
| 2,524,035 | Bardeen et al. | Oct. 3, 1950 |
| 2,563,504 | Pfann | Aug. 7, 1951 |
| 2,572,993 | Douglas et al. | Oct. 30, 1951 |
| 2,581,273 | Miller | Jan. 1, 1952 |
| 2,586 597 | Bardeen et al. | Feb. 19, 1952 |
| 2,644,914 | Kircher | July 7, 1953 |
| 2,662,976 | Pankove | Dec. 15, 1953 |

OTHER REFERENCES

"Experimental Germanium Crystal Amplifier," by S. Young White, Audio Engineering, published August 1948, pages 28, 29, 39.

Notice of Adverse Decision in Interference

In Interference No. 88,062 involving Patent No. 2,713,117, R. W. Haegele, Heterodyne converter, final judgment adverse to the patentee was rendered July 12, 1957, as to claim 6.

[*Official Gazette October 1, 1957.*]